United States Patent [19]
Sakoda et al.

[11] Patent Number: 5,808,357
[45] Date of Patent: Sep. 15, 1998

[54] SEMICONDUCTOR DEVICE HAVING RESIN ENCAPSULATED PACKAGE STRUCTURE

[75] Inventors: Hideharu Sakoda; Yoshiyuki Yoneda; Kazuto Tsuji, all of Kawasaki, Japan

[73] Assignee: Fujitsu Limited, Kawasaki, Japan

[21] Appl. No.: 487,539

[22] Filed: Jun. 7, 1995

Related U.S. Application Data

[63] Continuation of Ser. No. 67,077, May 26, 1993, abandoned.

[30] Foreign Application Priority Data

Jun. 2, 1992 [JP] Japan .................................. 4-141557

[51] Int. Cl.$^6$ .................................................. H01L 23/48
[52] U.S. Cl. .......................... 257/693; 257/664; 257/678; 257/694; 257/697; 257/691
[58] Field of Search ..................................... 257/691, 693, 257/697, 698, 678, 687, 690, 692, 696, 700, 711, 734, 735, 664, 684, 694

[56] References Cited

U.S. PATENT DOCUMENTS

| | | | |
|---|---|---|---|
| 4,742,385 | 5/1988 | Kohmoto | 257/691 |
| 5,097,319 | 3/1992 | Satriano | 257/696 |
| 5,162,896 | 11/1992 | Takubo et al. | 257/664 |
| 5,225,709 | 7/1993 | Nishiuma et al. | 257/692 |
| 5,250,841 | 10/1993 | Sloan et al. | 257/693 |

FOREIGN PATENT DOCUMENTS

| | | |
|---|---|---|
| 61-48952 | 3/1986 | Japan . |
| 1-244655 | 9/1989 | Japan . |
| 2-119168 | 5/1990 | Japan . |
| 2-164058 | 6/1990 | Japan . |
| 2180054 | 7/1990 | Japan . |
| 2254747 | 10/1990 | Japan . |
| 3205859 | 9/1991 | Japan . |
| 4127563 | 4/1992 | Japan . |

OTHER PUBLICATIONS

IBM Technical Disclosure Bulletin; vol. 33, No. 2, Jul. 1990.

Primary Examiner—Jerome Jackson
Assistant Examiner—Nathan K. Kelley
Attorney, Agent, or Firm—Staas & Halsey

[57] ABSTRACT

A semiconductor device includes a substrate having a first surface, a second surface and at least one conductor parts which are exposed at both the first and second surfaces of the substrate, a semiconductor chip provided on the first surface of the substrate and having a plurality of electrode pads, a plurality of leads, a plurality of bonding-wires electrically connecting the leads and the conductor parts to corresponding ones of the electrode ads of the semiconductor chip, and a resin package encapsulating the semiconductor chip, part of the leads, and the substrate so that the conductor parts are exposed at the second surface of the substrate.

14 Claims, 16 Drawing Sheets

F I G. 1 5
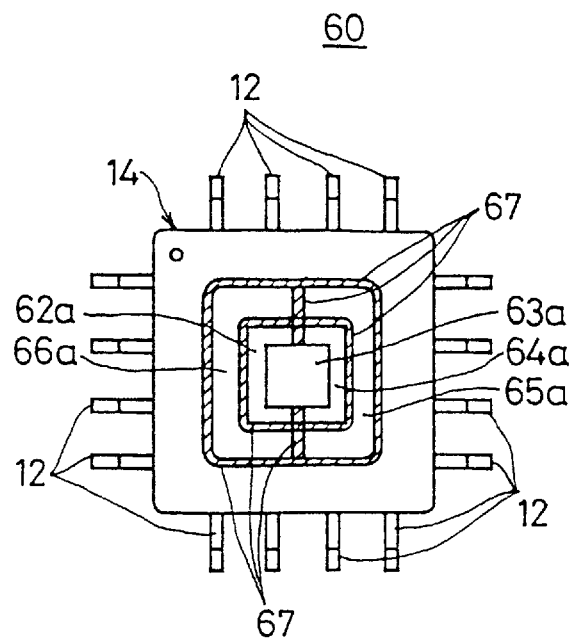
F I G. 1 6
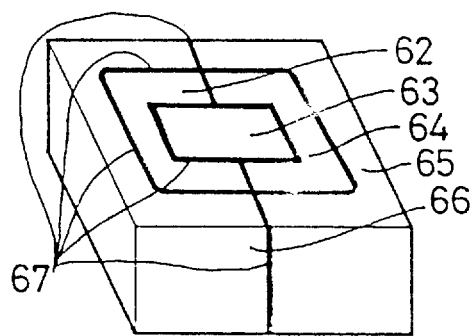

F I G. 1 7
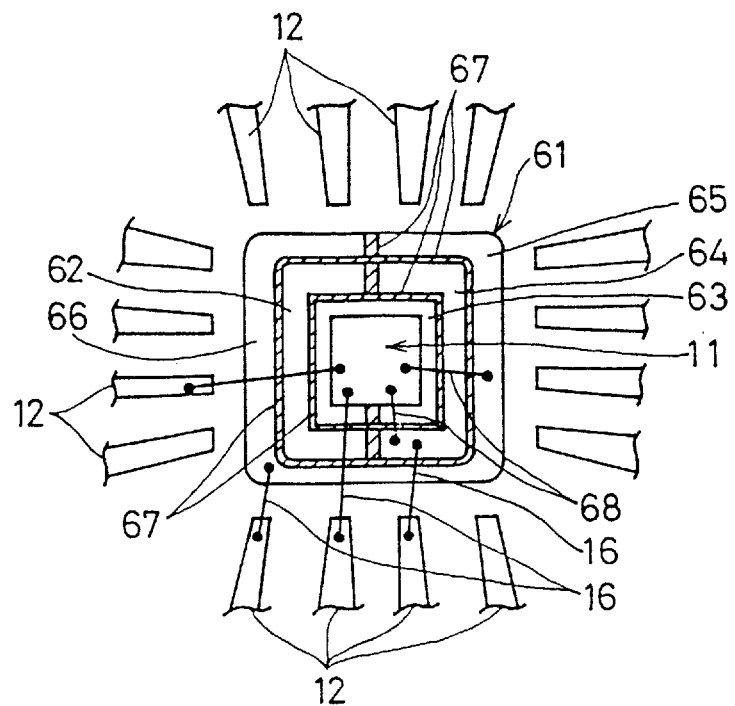
F I G. 1 8
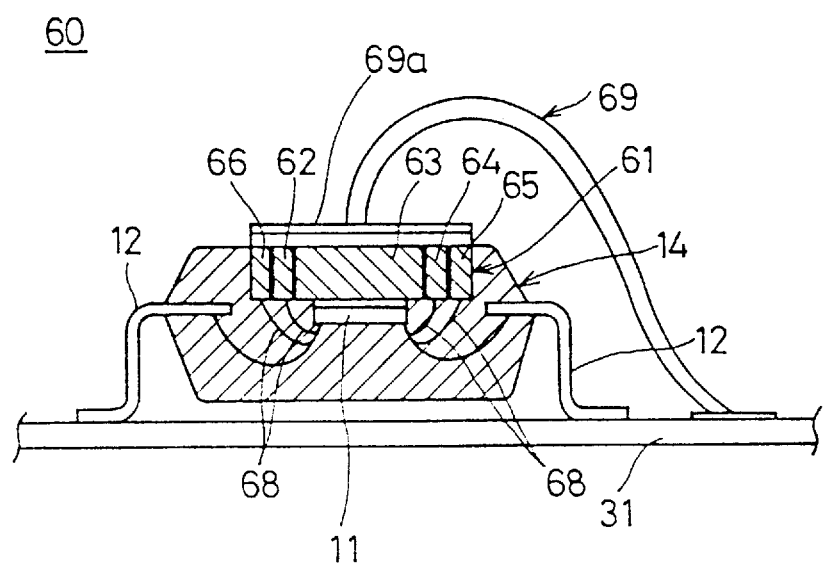

SEMICONDUCTOR DEVICE HAVING RESIN ENCAPSULATED PACKAGE STRUCTURE

This application is a continuation, of application number 08/067,077, filed May 26, 1993, now abandoned.

BACKGROUND OF THE INVENTION

The present invention generally relates to semiconductor devices, and more particularly, to a semiconductor device having a plastic or resin encapsulated package structure.

Recently, the demands for further improved integration density and operation speed of semiconductor devices have increased. But as the integration density of the semiconductor device is increased, the number of leads increases. The effects of the lead inductance become a problem as the operation speed of the semiconductor device is increased. Accordingly, there are demands to realize a semiconductor device which can cope with both the increasing number of leads and the lead inductance.

FIG. 1 shows an example of a conventional semiconductor device. A semiconductor device 1 shown in FIG. 1 is the so-called quad flat package (QFP) type, and a semiconductor chip 3 is mounted on a stage 2 which is positioned at a central part of the semiconductor device 1. The semiconductor chip 3 and leads 4 are electrically connected by wires 5 which wire-bond inner leads 4a of the leads 4 to the semiconductor chip 3. The semiconductor chip 3 and the inner leads 4a are resin-encapsulated by a resin package 6. Furthermore, outer leads 4b of the leads 4 extend outside the resin package 6 and are bent in a gull-wing shape so as to facilitate surface mounting of the semiconductor device 1.

The semiconductor chip 3 of the semiconductor device 1 having the construction described above has a high integration density and is used as an application specific integrated circuit (ASIC), for example. For this reason, the number of the leads 4 exceeds 300, for example. In addition, the switching speed of the semiconductor chip 3 is extremely high in order to realize a high-speed processing.

However, according to the semiconductor device 1, only the leads 4 are provided to electrically connect the semiconductor chip 3 to an external circuit substrate. Hence, as the integration density of the semiconductor chip 3 increases and the number of electrodes to be connected increases, the number of leads 4 inevitably increases considerably.

On the other hand, there are also demands to reduce the size of the semiconductor device 1 in order to improve the mounting efficiency thereof. For this reason, it is not possible to simply increase the size of the resin package in order to meet these demands. Accordingly, in order to cope with the increasing number of the leads 4, the size of each lead 4 itself must be reduced. However, if the size of each lead 4 is reduced, the inductance per lead 4 increases.

If the inductance of each lead 4 increases, the noise from the leads 4 becomes large, and even if the semiconductor chip 3 carries out a high-speed processing, the high-speed operation of the semiconductor device 1 as a whole is interfered with by the noise from the leads 4.

Therefore, according to the conventional semiconductor device 1, there is a problem in that it is impossible to realize both high-speed operation and high integration density.

SUMMARY OF THE INVENTION

Accordingly, it is a general object of the present invention to provide a novel and useful semiconductor device in which the problem described above is eliminated.

Another and more specific object of the present invention is to provide a semiconductor device comprising a substrate having a first surface, a second surface, and at least one conductor part exposed at both the first and second surfaces of the substrate, a semiconductor chip provided on the first surface of the substrate and having a plurality of electrode pads, a plurality of leads, a plurality of connecting means electrically connecting the leads and the conductor parts to corresponding ones of the electrode pads of the semiconductor chip, and a resin package encapsulating the semiconductor chip, a part of the leads, and the substrate so that at least the conductor parts are exposed at the second surface of the substrate. According to the semiconductor device of the present invention, it is possible to electrically connect the semiconductor chip and an external circuit substrate not only via the leads but also via the conductor part. In addition, it is possible to reduce the inductance as compared to the case where the leads are used for the electrical connection, and therefore realize high-speed operation of the semiconductor device. Furthermore, since the leads and the conductor part are separated, it is possible to prevent the power supply noise from mixing into the signal leads.

Still another object of the present invention is to provide a semiconductor device adapted to be mounted on an external circuit substrate having a mounting surface and one or a plurality of conductor patterns formed on the mounting surface, comprising a substrate having a first surface, a second surface, and at least one conductor parts which are exposed at both the first and second surfaces of the substrate, a semiconductor chip provided on the first surface of the substrate and having a plurality of electrode pads, a plurality of leads, a plurality of connecting means electrically connecting the leads and the conductor parts to corresponding ones of the electrode pads of the semiconductor chip, and a resin package encapsulating the semiconductor chip, a part of the leads, and the substrate so that at least the conductor parts are exposed at the second surface of the substrate. Each conductor part of the substrate may be located at a position such that the conductor parts make contact with corresponding ones of the conductor patterns of the external circuit substrate when the semiconductor device is mounted on the mounting surface of the external circuit substrate. Alternatively, each conductor part of the substrate may include a part which connects to a first end of an electric cord which has a second end connected to a corresponding one of the conductor patterns of the external circuit substrate.

Other objects and further features of the present invention will be apparent from the following detailed description when read in conjunction with the accompanying drawings.

BRIEF DESCRIPTION OF THE DRAWINGS

FIG. 15 is a plan view showing the third embodiment;

FIG. 16 is a perspective view showing an electrode member on an enlarged scale;

FIG. 17 is a plan view showing the connections of a semiconductor chip, the electrode member and leads of the third embodiment;

FIG. 18 is a cross sectional view showing the third embodiment mounted on the external circuit substrate;

DESCRIPTION OF THE PREFERRED EMBODIMENTS

Figure 1:
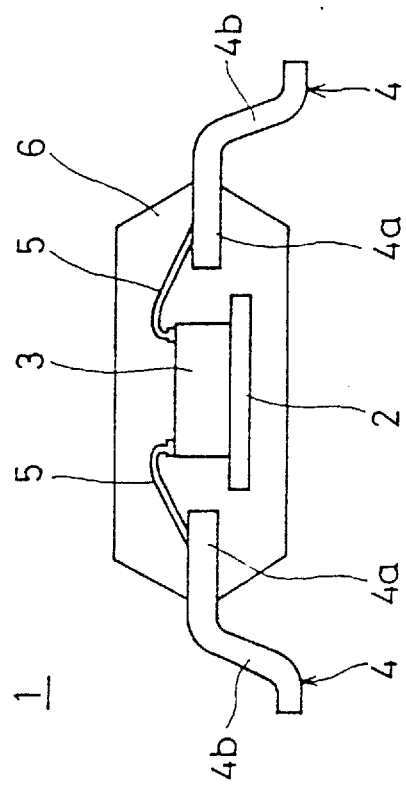
FIG. 1 is a cross sectional view showing an example of a conventional semiconductor device.
Figure 2:
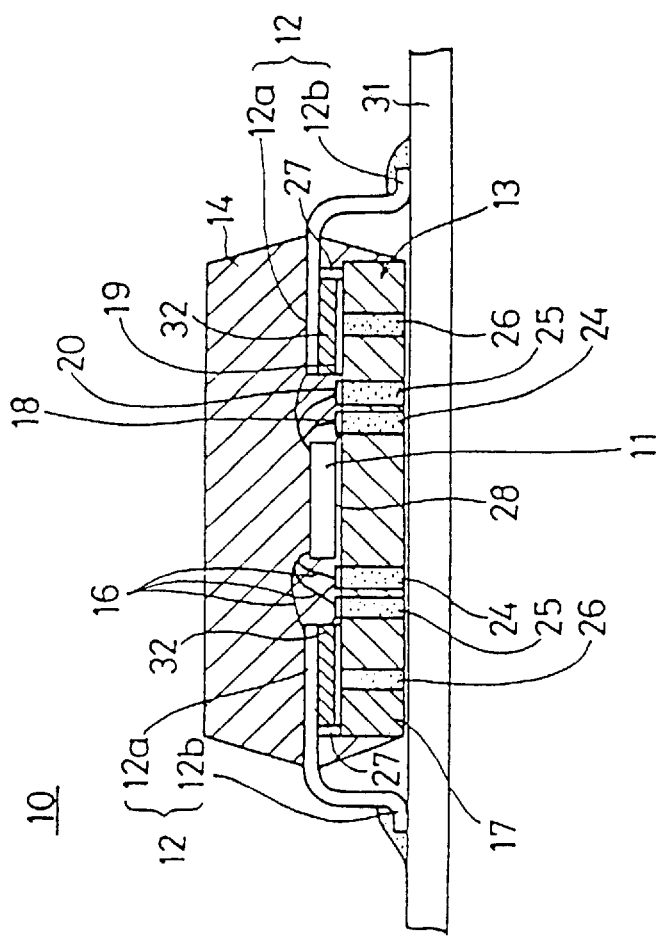
FIG. 2 is a cross sectional view showing a first embodiment of a semiconductor device according to the present invention.

A description will be given of a first embodiment of a semiconductor device according to the present invention, by referring to FIGS. 2 and 3. FIG. 2 shows a cross section of a semiconductor device 10, and FIG. 3 shows a plan view of the semiconductor device 10 with a resin package 14 thereof omitted.

Figure 3:
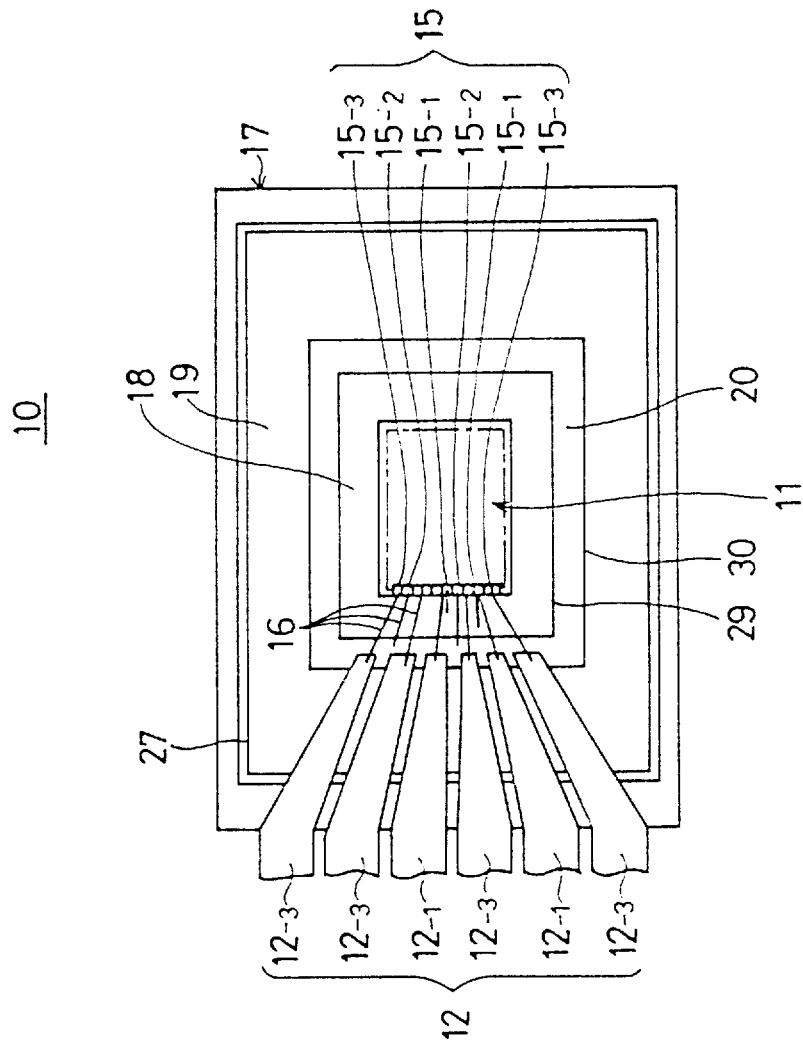
FIG. 3 is a plan view showing the first embodiment with a resin package thereof omitted.

As shown in FIGS. 2 and 3, the semiconductor device 10 generally includes a semiconductor chip 11, leads 12, a substrate 13 and the resin package 14.

The semiconductor chip 11 is an ASIC microcomputer chip, for example, and has a high integration density. A plurality of electrode pads 15 such as a power source electrode, a ground electrode and signal electrodes are provided on the top part of the semiconductor chip 11. The semiconductor chip 11 is die-bonded at a central part of the substrate 13 which will be described later.

Each lead 12 is made up of an inner lead 12a and an outer lead 12b. The leads are arranged so as to generally surround the semiconductor chip 11. The leads 12 and the semiconductor chip 11 are electrically connected by bonding wires 16 which wire-bond the inner leads 12a of the leads 12 to the electrode pads 15 of the semiconductor chip 11. The outer leads 12b extend outside the resin package 14, and are bent in a gull-wing shape so as to facilitate the surface mounting of the semiconductor device 10.

Figure 4:
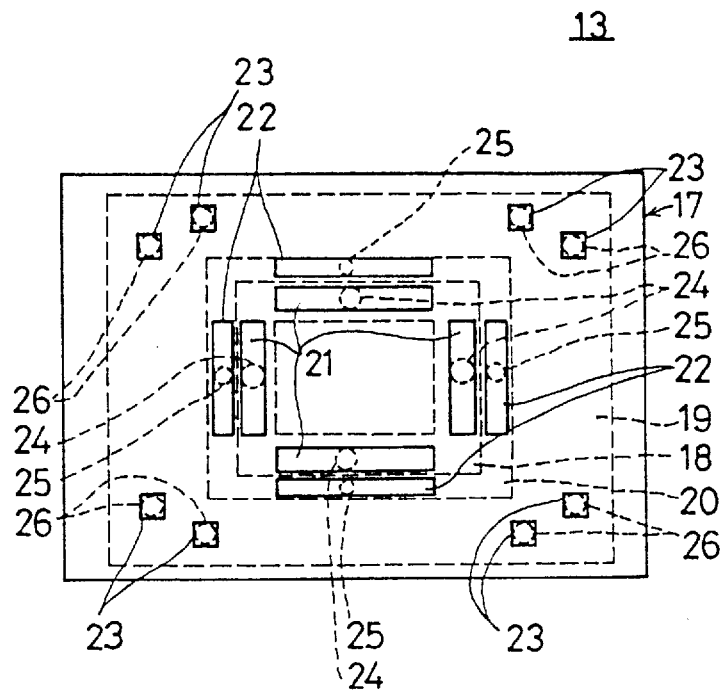
FIG. 4 is a bottom view showing a substrate of the first embodiment.
Figure 5:
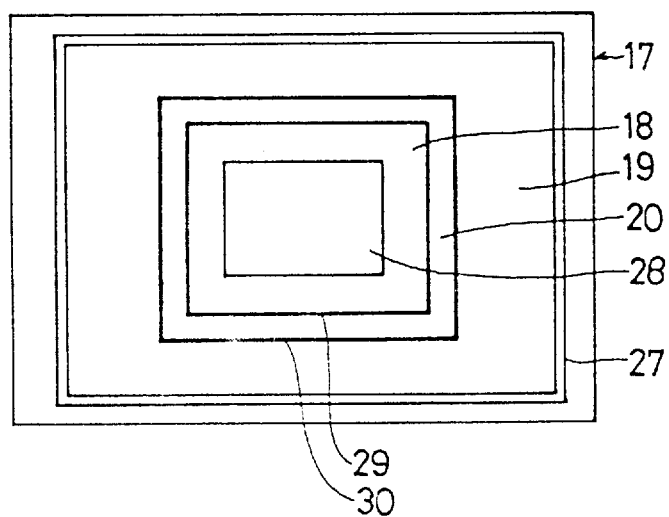
FIG. 5 is a plan view showing the substrate of the first embodiment.

The substrate 13 forms an essential part of this embodiment. This substrate 13 includes a substrate body 17 which is made of ceramics, various patterns formed on the substrate body 17, via conductors 24 through 26 formed in the substrate body 17, and a lead supporting projection 27. The various patterns formed on the substrate body 17 include ground patterns 18 and 19, a power supply pattern 20, and connecting patterns 21 through 23. FIGS. 4 and 5 show the substrate 17 on an enlarged scale. FIG. 4 shows a bottom view of the substrate 17, and FIG. 5 shows a plan view of the substrate 17.

In the following description, a surface of the substrate 13 on which the semiconductor chip 11 is mounted will be referred to as the top surface of the substrate 13, and a surface opposite to this top surface will be referred to as the bottom surface of the substrate 13.

As shown in FIG. 5, a chip mounting part 28 on which the semiconductor chip 11 is mounted is provided at a central part of the top surface of the substrate 13. The ground pattern 18, the power supply pattern 20, the ground pattern 19 and the lead support projection 27 are provided on the outer peripheral side of the chip mounting part 28, from the inner part towards the outer part of the substrate 13.

A single conductor pattern layout comprises ground patterns 18 and 19, power supply pattern 20 and insulator parts 29 and 30. The ground patterns 18 and 19, and the power supply pattern 20 are respectively made up of a thin film of a conductive metal such as a lead alloy. This thin film of the conductor metal may be formed by techniques such as sputtering, plating and thin film printing. In addition, insulator parts 29 and 30 are provided in the boundary parts of the patterns 18 through 20, so that unwanted short-circuiting of the power supply pattern 20 and the ground patterns 18 and 19 will not occur.

Next, a description will be given of the electrical connection of the electrode pad 15 and the lead 12 and the electrical connections of the electrode pads 15 and the patterns 18 through 20, by referring to FIG. 3. In FIG. 3, the electrode pads 15 include pads 15-1 of a ground electrode, pads 15-2 of a power supply electrode, and pads 15-3 of a signal electrode. In this embodiment, the ground electrode pads 15-1 are electrically connected to the ground patterns 18 and 19 by the bonding wires 16, and are also electrically connected to a ground lead 12-1 out of the leads 12. Each signal electrode pad 15-3 is electrically connected to a corresponding signal lead 12-3 out of the leads 12.

Accordingly, the ground patterns 18 and 19 are electrically connected to the ground electrode of the semiconductor chip 11, and the power supply pattern 20 is electrically connected to the power supply electrode of the semiconductor chip 11. In addition, not all leads 12 are used as the signal leads 12-3, and the lead arrangement is such that the ground lead 12-1 is provided among the signal leads 12-3.

Next, a description will be given of the via conductors 24 through 26 which are formed in the substrate body 17, by referring to FIG. 2. A via conductor is provided in a multi-level (multi-layer) ceramic substrate for making electrical connections to each of the levels (layers). The via conductor is made by forming a via hole in each of the ceramic levels (layers), filling a conductor material such as copper powder in the formed via hole, and baking the multi-level (multi-layer) ceramic substrate. By providing the via conductor, it is possible to make an electrical connection to the pattern of each of the ceramic levels (layers) of the multi-level (multi-layer) ceramic substrate, and the use of this via conductor is a well known technique in the field of ceramic packages.

In this embodiment, the via conductors 24 through 26 respectively penetrate the substrate body 17 from the top surface to the bottom surface thereof. The via conductors 24 through 26 respectively make electrical connections to the corresponding patterns 18, 20 and 19 at the top surface of the substrate body 17. More particularly, the via conductor 24 electrically connects to the ground pattern 18 at the inner part, the via conductor 25 electrically connects to the power supply pattern 20 at the central part, and the via conductor 26 electrically connects to the ground pattern 19 at the outer part of the substrate body 17.

On the other hand, at the bottom surface of the substrate 13, the connecting patterns 21 through 23 are provided at positions corresponding to the positions of the via conductors 24 through 26. These connecting patterns 21 through 23 are also made of a conductive metal thin film which is sputtered, plated, printed or the like, similarly to the patterns 18 through 20 which are provided on the top surface of the substrate 13. The connecting pattern 21 is used as a ground pattern, and is provided at a position confronting the ground patterns 18 and 19 which are formed on the top surface of the substrate 13. The connecting pattern 22 is used as a power supply pattern, and is provided at a position confronting the power supply pattern 20 which is formed on the top surface of the substrate 13.

Furthermore, the via conductor 24 which is electrically connected to the ground pattern 18 is electrically connected to the connecting pattern 21 on the bottom surface of the substrate 13. Similarly, the via conductor 26 which is electrically connected to the ground pattern 19 is electrically connected to the connecting pattern 23 on the bottom surface of the substrate 13, and the via conductor 25 which is electrically connected to the power supply pattern 20 is electrically connected to the connecting pattern 22 on the bottom surface of the substrate 13.

Therefore, the ground electrode pads 15-1 of the semiconductor chip 11 are drawn out to the ground patterns 21 and 23 via the ground patterns 18 and 19 and the via conductors 24 and 26, respectively. On the other hand, the power supply electrode pad 15-2 of the semiconductor chip 11 is drawn out to the connecting pattern 22 via the power supply pattern 20 and the via conductor 25. In other words, although the conventional semiconductor device uses only the leads to electrically connect the semiconductor chip and the external circuit substrate, this embodiment electrically connects the semiconductor chip 11 and an external circuit substrate 31 shown in FIGS. 2 and 7 using the substrate 13 in addition to using the leads 12.

Figure 6:
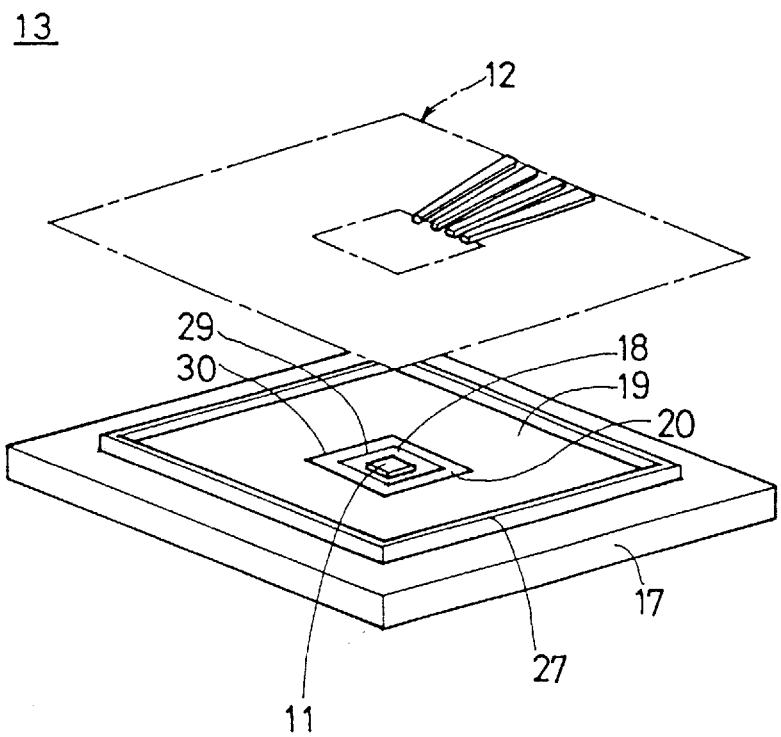
FIG. 6 is a perspective view showing the substrate of the first embodiment.

The lead support projection 27 is integrally formed on the substrate body 17 when the substrate body 17 is made from the ceramics. As best shown in FIG. 6, the lead support projection 27 surrounds the outer peripheral vicinity of the top surface of the substrate 13. As shown in FIGS. 2 and 6, the leads 12 rest on the lead support projection 27 in the assembled state. In addition, an insulative adhesive material 32 is provided between the leads 12 and the ground pattern 19, so as to prevent short-circuiting of the leads 12 and the ground pattern 19. By supporting the leads 12 by the lead support projection 27, it is possible to prevent deformation of the leads 12 at the time when the resin package 14 is molded.

Next, a description will be given of the resin package 14. The resin package 14 is made of an epoxy resin, for example, and encapsulates the semiconductor chip 11, the inner leads 12a of the leads 12 and the substrate 13. This resin encapsulation by the resin package 14 protects the semiconductor chip 11, the inner leads 12a and the substrate 13. In a state where the substrate 13 is encapsulated by the resin package 14, the bottom surface of the substrate 13 is exposed from the resin package 14. Accordingly, the connecting patterns 21 through 23 provided on the bottom surface of the substrate 13 are also exposed to the outside, thereby enabling electrical connection to the external circuit substrate 31.

Figure 7:
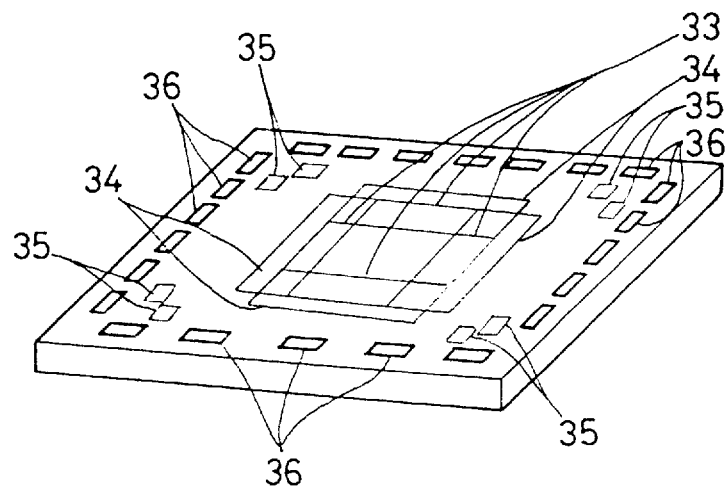
FIG. 7 is a perspective view showing an external circuit substrate.

FIG. 7 shows the external circuit substrate 31 on which the above described semiconductor device 10 is mounted. A plurality of lead patterns 33 through 36 are provided at a mounting position of the external circuit substrate 31 where the semiconductor device 10 is mounted. Out of these lead patterns 33 through 36, the ground lead pattern 33 is formed at the innermost part so as to correspond to the connecting pattern 21 shown in FIG. 4 which is formed on the bottom surface of the substrate 13 of the semiconductor device 10. The power supply lead pattern 34 is formed so as to correspond to the connecting pattern 22 of the substrate 13, and the ground lead pattern 35 is formed so as to correspond to the connecting pattern 23 of the substrate 13. In addition, the signal pattern 36 is formed at the outermost part so as to correspond to the leads 12.

When mounting the semiconductor device 10 on the external circuit substrate 31, a solder paste is coated on the outer leads 12b of the leads 12, similarly to the case of the normal surface mounting. On the other hand, solder bumps are formed with respect to each of the patterns 21 through 23 which are formed on the bottom surface of the substrate 13. Then, the semiconductor device 10 is placed on the external circuit substrate 31 at a predetermined position such that the corresponding leads and lead patterns confront one another, and a reflow process is carried out to connect by solder the patterns 21 through 23 and the outer leads 12b to the corresponding lead patterns 33 through 36 which are formed on the external circuit substrate 31.

FIG. 2 shows a mounted state where the semiconductor device 10 is mounted on the external circuit substrate 31 by the solder. Next, a description will be given of the operation of the semiconductor device 10 which is mounted on the external circuit substrate 31, by referring to FIG. 2.

As described above, the semiconductor device 10 includes the substrate 13 which has the ground patterns 18 and 19, the power supply pattern 20, the connecting patterns 21 through 23, and the via conductors 24 through 26. For this reason, the electrode pads 15-1 and 15-2 of the semiconductor chip 11, used by the power supply system, can be electrically connected to the external circuit substrate 31 without the use of the leads 12.

A comparison will be made between the inductance which acts when the semiconductor chip 11 and the external circuit substrate 31 are electrically connected using the leads 12, and the inductance which acts when the semiconductor chip 11 and the external circuit substrate 31 are electrically connected using the via conductors 24 through 26 and the like. If the leads 12 are used for the electrical connection, the inductance of each lead 12 itself is large because each lead 12 extends outwards for a relatively long distance and also because the size of each lead is small in order to provide a large number of leads in conformance with the high integration density of the semiconductor chip 11.

On the other hand, in this first embodiment which uses the substrate 13 to electrically connect the semiconductor chip 11 and the external circuit substrate 31, it is possible to draw out the electrode pads 15-1 and 15-2 at positions immediately under the semiconductor chip 11 since the via conductors 24 through 26 penetrate the substrate body 17. For this reason, it is possible to shorten the electrical path (wiring length) between the semiconductor chip 11 and the external circuit substrate 31, thereby enabling reduction of the inductance related to the power supply system. Therefore, it is possible to suppress the generation of power supply noise caused by simultaneous switching, and also cope with the high-speed process of the semiconductor chip 11.

In addition, this first embodiment electrically connects the electrode pad 15-1 to the external circuit substrate 31 not only via the substrate 13, but also electrically connects the electrode pad 15-1 to the external circuit substrate 31 via the lead 12-1. In other words, the electrical connection of the power supply system of the semiconductor chip 11 to the external circuit substrate 31 is made via both the substrate 13 and the leads 12. Accordingly, by providing the substrate 13, it is possible to reduce the power supply noise when the semiconductor chip 11 and the external circuit substrate 31 are electrically connected. In addition, by providing the ground leads 12-1 among the signal leads 12-3, it is possible to reduce the signal system noise. Therefore, both the power supply noise and the signal system noise can be effectively reduced according to the semiconductor device 10.

The substrate 13 having the shorter wiring path compared to that of the leads 12 substantially functions as the power supply wiring. Hence, the via conductors 24 through 26 and the like which become the power supply wiring and the signal leads 12-3 are substantially separated, and the power supply noise will not mix into the signal leads 12-3.

On the other hand, in the semiconductor device 10, the ground pattern 19 is provided on the substrate 13 at a position confronting the leads 12 as shown in FIGS. 2 and 6. By providing this ground pattern 19 which does not electrically connect to the semiconductor chip 11 under the inner leads 12a of the leads 12, it is possible to realize a pseudo microstrip structure at the inner lead portion. As a result, it is possible to keep the inductance of each signal lead 12-3 low and contribute to the high-speed operation of the semiconductor device 10. In addition, since the ground pattern 19 has a shield effect, it is also possible to reduce the noise such as crosstalk noise which is generated due to the connection as compared to the case where only the leads 12 are provided. Because the ground pattern 19 is not directly connected to the semiconductor chip 11, the ground pattern 19 does not need to have a specific shape. However, from the point of view of improving the shield effect, it is desirable that the ground pattern 19 has as large an area as possible.

During operation of the semiconductor chip 11 which has the high integration density, heat is generated from the semiconductor chip 11. But in this embodiment, the semiconductor chip 11 is mounted on the ceramic substrate 13 which has a satisfactory heat radiation characteristic, and the heat generated from the semiconductor chip 11 can be radiated efficiently. In addition, since the bottom surface of the substrate 13 is exposed to the outside, the heat is radiated to the outside via this exposed part of the substrate 13, thereby also improving the heat radiation characteristic.

Next, a description will be given of a method of producing the semiconductor device 10. The semiconductor device 10 can be produced by processes which are generally the same as those required when producing a resin package type semiconductor device. Accordingly, in the following description of the production process related to the semiconductor device 10 only those processes which are different from the conventional processes will be described.

Figure 8A:
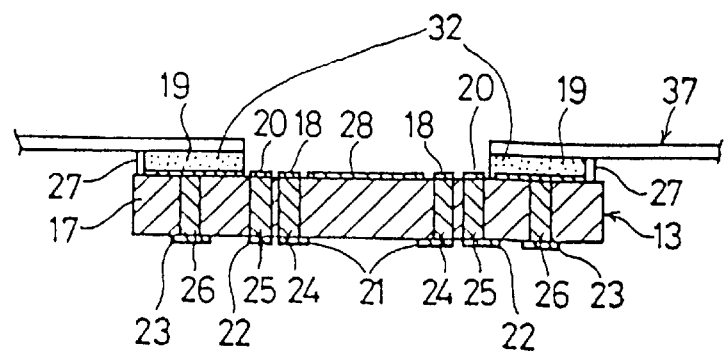
FIGS. 8(A) and (B) show cross sectional views for explaining a process of connecting a lead frame and the substrate.

Unlike the conventional semiconductor device, the semiconductor device 10 has the substrate 13. FIG. 8 (A) shows a process of connecting the substrate 13 to a lead frame 37. Before this connecting process, the patterns 13 through 23 and the via conductors 24 through 26 of the substrate 13 are already formed. In addition, a pressing process is already carried out on the lead frame 37, and the leads 12 and the like are already formed. No stage is formed on the lead frame 37 because the semiconductor chip 11 is mounted on the substrate 13 of the semiconductor device 10.

The substrate 13 and the lead frame 37 are connected by an insulative adhesive agent 32. The insulative adhesive agent 32 is applied at positions between the inner leads 12a of the lead frame 37 and the ground pattern 19. As a result, it is possible to prevent deformation of the inner leads 12a during a molding process which is carried out at a later stage, and also prevent short-circuiting of the inner leads 12a and the ground pattern 19. In addition, since the ground pattern 19 has a relatively large area as shown in FIGS. 5 and 6, the bonding strength between the substrate 13 and the lead frame 37 is strong.

Figure 8B:
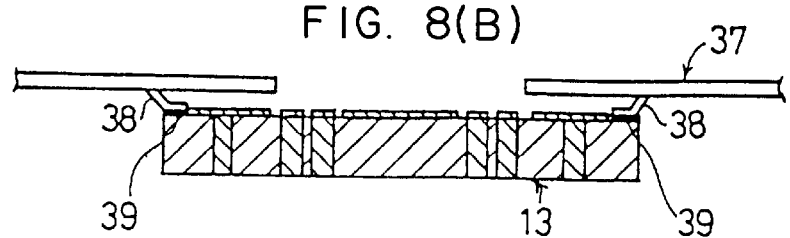

The connection of the substrate 13 and the lead frame 37 is not limited to using the adhesive agent 32 as described above. For example, it is possible to connect the substrate 13 and the lead frame 37 using an adhesive tape or the like. In addition, as shown in FIG. 8(B), the substrate 13 and the lead frame 37 may be connected by providing a support 38 on the lead frame 37 for supporting the substrate 13 and a metallizing part 39 at a predetermined position of the substrate 13, so that the substrate 13 and the lead frame 37 may be connected by welding the support 38 and the metallizing part 39. Furthermore, the process of connecting the substrate 13 and the lead frame 37 may be carried out before the semiconductor chip 11 is mounted on the substrate 13 or after the semiconductor chip 11 is mounted on the substrate 13 and the wire bonding process is carried out. However, when the possibility of damaging the semiconductor chip 11 is taken into consideration, it is desirable that the process of connecting the substrate 13 and the lead frame 37 is carried out before the semiconductor chip 11 is mounted on the substrate 13.

After the substrate 13 is connected to the lead frame 37 as described above, the semiconductor chip 11 is die-bonded on the chip mounting part 28 of the substrate 13. Then, the electrode pads 15 of the semiconductor chip 11 and the inner leads 12a are wire-bonded. After these processes, the lead frame 37 connected to the substrate 13 is fit into a die 40 shown in FIG. 9 and a resin molding process is carried out to form the resin package 14.

Figure 9:
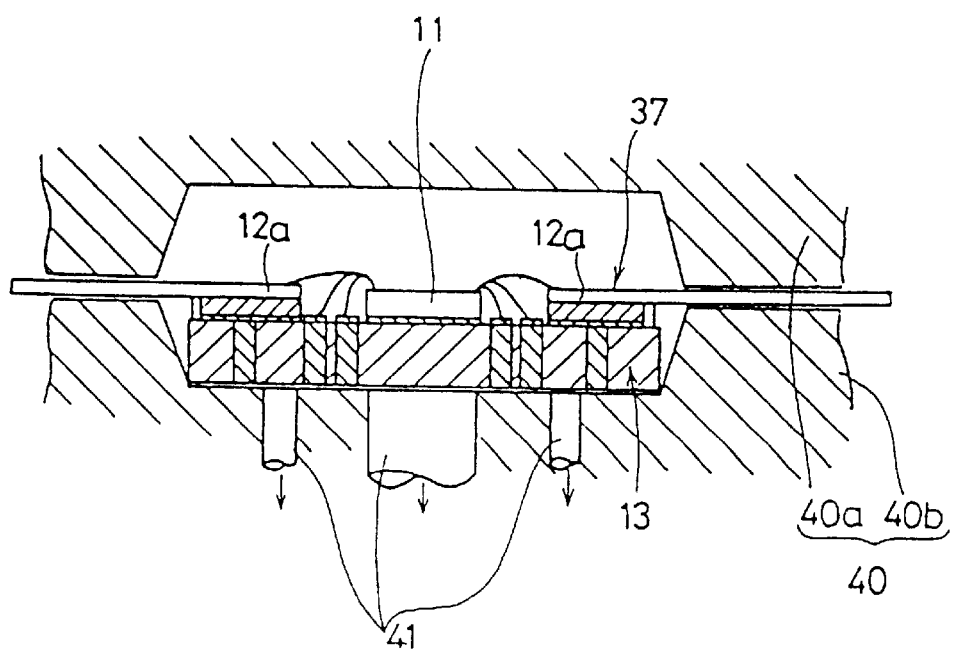
FIG. 9 is a cross sectional view for explaining a molding process.

FIG. 9 shows a state where the lead frame 37 is fit into the die 40 which is made up of upper and lower dies 40a and 40b. As described above, it is necessary to electrically connect the semiconductor device 10 to the external circuit substrate 31, and for this reason, the bottom surface of the substrate 13 must be exposed to the outside from the resin package 14. Hence, suction pipes 41 are provided at the surface of the lower die 40b confronting the substrate 13, so as to carry out a vacuum suction as indicated by arrows in FIG. 9.

When molding the resin, the vacuum suction with respect to the substrate 13 is carried out via the suction pipes 41. Thus, the substrate 13 is pushed against the cavity surface of the lower die 40b with a strong force, and the resin will not enter between the bottom surface of the substrate 13 and the cavity surface of the lower die 40b. Accordingly, the resin will not adhere on the bottom surface of the substrate 13, and it is possible to positively make the electrical connections between the connecting patterns 21 through 23 and the external circuit substrate 31 at the time of the mounting. In addition, since the ceramic substrate 13 is pushed against the cavity surface of the lower die 40b at the time of the resin molding when a heating process is carried out, it is also possible to prevent the substrate 13 from warping.

As a means of positively preventing the resin from adhering on the bottom surface of the substrate, it is possible to adhere a heat resistant tape on the bottom surface of the substrate 13 or coat a resin on the bottom surface of the substrate 13 before fitting the lead frame 37 into the die 40, and remove the tape or the coated resin after the molding process is finished. By taking such measures, it is possible to more positively prevent the resin from adhering on the bottom surface of the substrate 13.

Figure 10:
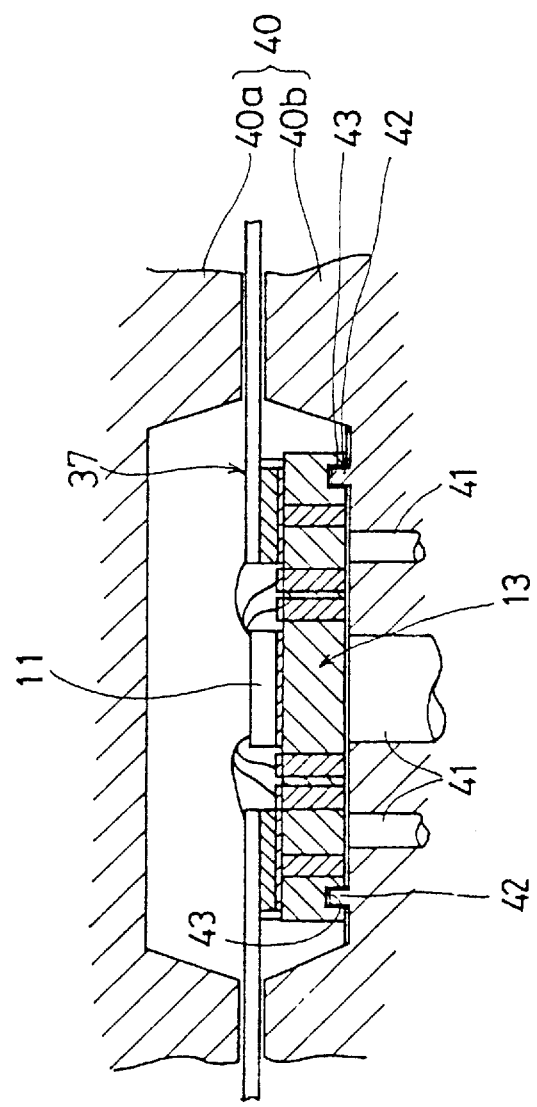
FIG. 10 is a cross sectional view for explaining the molding process.

As shown in FIG. 10, a positioning projection 42 may be provided on the lower die 40b so as to engage a corresponding positioning hole 43 which is formed at a predetermined part of the substrate 13. In this case, the positioning hole 43 is engaged by the positioning projection 42 when fitting the lead frame 37 into the die 40, so that the lead frame 37 is positioned within the die 40.

When the resin molding process ends, processes such as an external package soldering process, a process of cutting unwanted parts of the lead frame 37 and a process of forming the outer leads 12b are carried out. Such processes are carried out by known methods, and a description thereof will be omitted.

Figure 11:
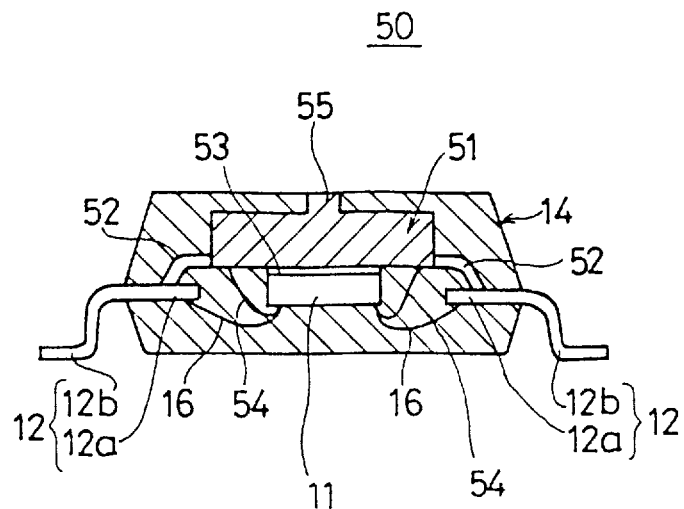
FIG. 11 is a cross sectional view showing a second embodiment of the semiconductor device according to the present invention.
Figure 12:
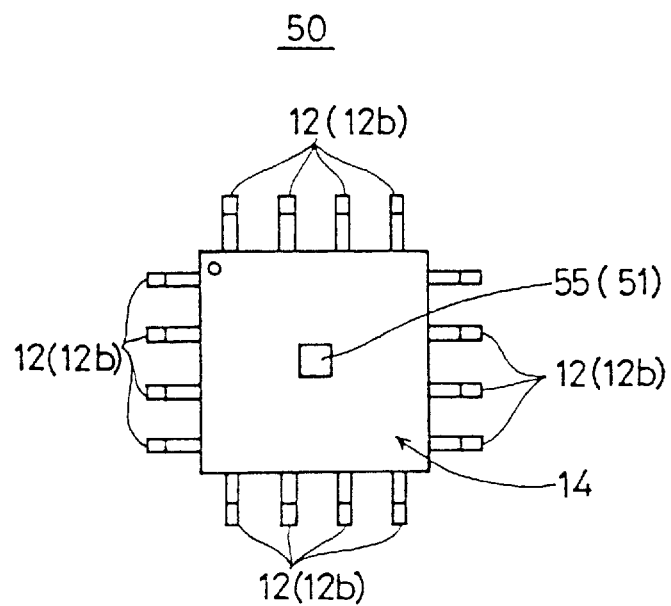
FIG. 12 is a plan view showing the second embodiment.

Next, a description will be given of a second embodiment of the semiconductor device according to the present invention, by referring to FIGS. 11 and 12. FIG. 11 shows a cross section of a semiconductor device 50, and FIG. 12 shows a plan view of the semiconductor device 50. In FIGS. 11 and 12, those parts which are the same as those corresponding parts of the semiconductor device 10 shown in FIGS. 2 and 3 are designated by the same reference numerals, and a description thereof will be omitted.

The first embodiment, that is, the semiconductor device 10, electrically connects the semiconductor chip 11 and the external circuit substrate 31 via an electrical path different from the leads 12 by using the substrate 13, so as to reduce the power supply noise. But this second embodiment, that is, the semiconductor device 50, provides an electrode member 51 in place of the substrate 13, and electrically connects the semiconductor chip 11 and the external circuit substrate 31 via the electrode member 51.

The electrode member 51 is made of a material which has a satisfactory conductive characteristic and heat radiation characteristic, such as oxygen-free copper or high conduction copper alloy. The electrode member 51 is fixed to support leads 52. As shown in FIG. 11, the electrode member 51 has a relatively large size, and provides a satisfactory electrical path such that the inductance thereof is extremely small compared to the inductance of the leads 12.

The semiconductor chip 11 is mounted on the electrode member 51 via an insulative die-bonding material 53 which may take the form of a tape. Out of the electrode pads which are provided on the semiconductor chip 11 but not shown in FIGS. 11 and 12, the ground electrode pad is connected to the electrode member 51 via a ground bonding wire 54. In addition, the other electrode pads are connected to the inner leads 12a of the leads by the bonding wires 16.

The electrode member 51 is encapsulated within the resin package 14, but a part of the electrode member 51 is exposed to the outside from the resin package 14 to function as an electrode pad 55. In this embodiment, the electrode pad 55 is exposed at the top part of the resin package 14. A plating process is carried out with respect to the top surface of the electrode pad 55 which is exposed from the resin package 55, before the resin molding process, so as to prevent unsatisfactory electrical connection caused by surface oxidation. For example, the plating process uses gold (Au), silver (Ag), palladium (Pg), nickel (Ni) and the like. The plating process which is carried out with respect to the electrode pad 55 may be carried out together with an external plating process which is carried out with respect to the leads 12.

Figure 13:
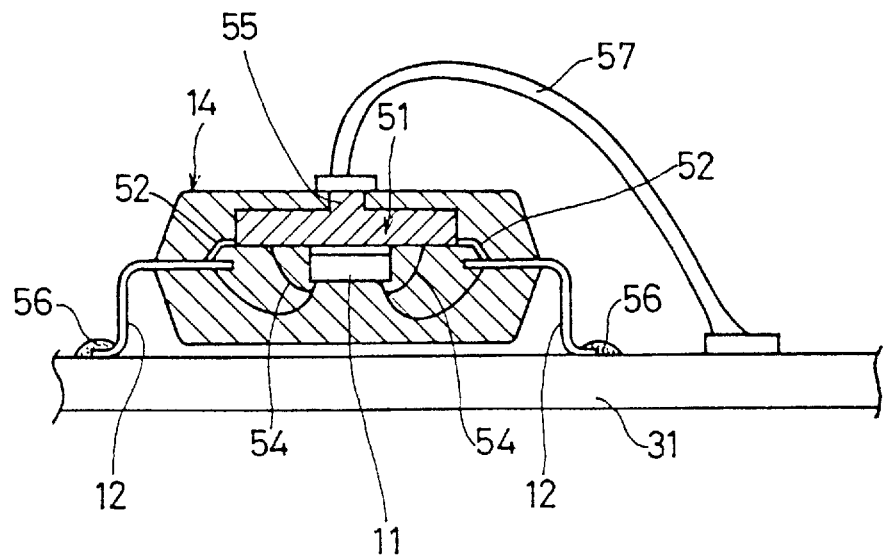
FIG. 13 is a cross sectional view showing the second embodiment mounted on the external circuit substrate.

FIG. 13 shows the semiconductor device 50 which is mounted on the external circuit substrate 31. As shown in FIG. 13, a solder 56 is used to electrically connect the lead 12 to the external circuit substrate 31, similarly to the conventional case. However, the electrical connection between the electrode pad 55 and the external circuit substrate 31 is realized by an electric cord 57. The connection between the electrode pad 55 and the electric cord 57 and the connection between the electric cord 57 and the external circuit substrate 31 are respectively made by soldering.

Unlike the leads 12, the electric cord 57 does not have a part which is closely adjacent thereto. For this reason, it is possible to use as the electric cord 57 a relatively thick copper wire having a low inductance or a coaxial cable having a large shielding effect. In addition, the electrode member 51 itself has the low inductance, as described above. Hence, by electrically connecting the semiconductor chip 11 to the external circuit substrate 31 via the electrode member 51 and the electric cord 57, it is possible to reduce the noise and realize a stable grounding of the semiconductor chip 11. Furthermore, because the electric cord 57 can be arranged with a large degree of freedom, the electric cord 57 can be connected to an arbitrary part of the external circuit substrate 31. Consequently, it is possible to facilitate the design of the lead patterns which are formed on the external circuit substrate 31.

In this embodiment, the electrode member 51 is electrically connected to the ground electrode pad of the semiconductor chip 11. However, it is possible to electrically connect the electrode member 51 to the power supply electrode pad of the semiconductor chip 11, and in this case, it is possible to realize a stable power supply to the semiconductor chip 11. In addition, according to the structure shown in FIG. 13, the semiconductor chip 11 is electrically connected to the external circuit substrate 31 by the electric cord 57 which may be a copper wire, a coaxial cable or the like. But it is of course possible to electrically connect the semiconductor chip 11 and the external circuit substrate 31 using a tape or a flexible substrate having a copper film pattern or the like formed thereon.

Figure 14:
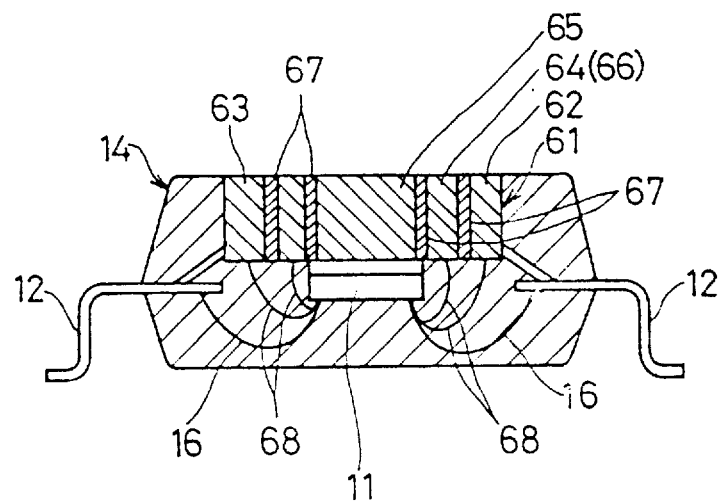
FIG. 14 is a cross sectional view showing a third embodiment of the semiconductor device according to the present invention.

Next, a description will be given of a third embodiment of the semiconductor device according to the present invention, by referring to FIGS. 14 and 15. FIG. 14 shows a cross section of a semiconductor device 60, and FIG. 15 shows a plan view of the semiconductor device 60. In FIGS. 14 and 15, those parts which are the same as those corresponding parts of the semiconductor device 10 shown in FIGS. 2 and 3 are designated by the same reference numerals, and a description thereof will be omitted.

According to the second embodiment, that is, the semiconductor device 50, the electrode member 51 only functions as a single electrode. However, in this third embodiment, an electrode member 61 of the semiconductor device 60 includes a plurality of electrodes. FIG. 16 shows the electrode member 61 on an enlarged scale. In FIG. 16, the electrode member 61 includes electrode parts 62 through 66, and insulator parts 67 provided at the boundaries of the electrode parts 62 through 66. Hence, each of the electrode parts 62 through 66 are electrically isolated from each other by the insulator parts 67.

As shown in FIG. 14, the electrode member 61 is embedded within the resin package 14 so that the top surface of the electrode member 61 is exposed to the outside. In addition, at the bottom surface of the electrode member 61, the electrode parts 62 through 66 are electrically connected to the power supply system electrode pads including the ground electrode pad and the power supply electrode pad of the semiconductor chip 11 via bonding wires 68. The leads and the signal electrode pads of the semiconductor chip 11 are electrically connected via the bonding wires 16.

FIG. 17 shows in part the electrical connection between the semiconductor chip 11 and the electrode member 61 via the bonding wires 68 and the electrical connection between the semiconductor chip 11 and the leads 12 via the bonding wires 16.

In addition, as shown in FIG. 15, a plurality of electrode pads 62a through 66a are exposed at the exposed top surface of the electrode member 61.

FIG. 18 shows the semiconductor device 60 which is mounted on the external circuit substrate 31. As described above, the semiconductor device 60 includes the plurality of electrode pads 62a through 66a which are provided at the part of the electrode member 61 exposed from the resin package 14. Hence, in this embodiment, a socket 69a and an electric cord 69 are used to electrically connect the electrode pads 62a through 66a to the external circuit substrate 31. The socket 69a includes a plurality of connecting electrodes which correspond to the electrode pads 62a through 66a, and is connected to one end of the electric cord 69. This electric cord 69 is made up of lead wires which are bundled, where the number of lead wires is equal to the number of electrode pads of the socket 69a. The process of electrically connecting the electrode pads 62a through 66a to the external circuit substrate 31 is facilitated because the electrical connection is realized by connecting a single electric cord 69.

Figure 19:
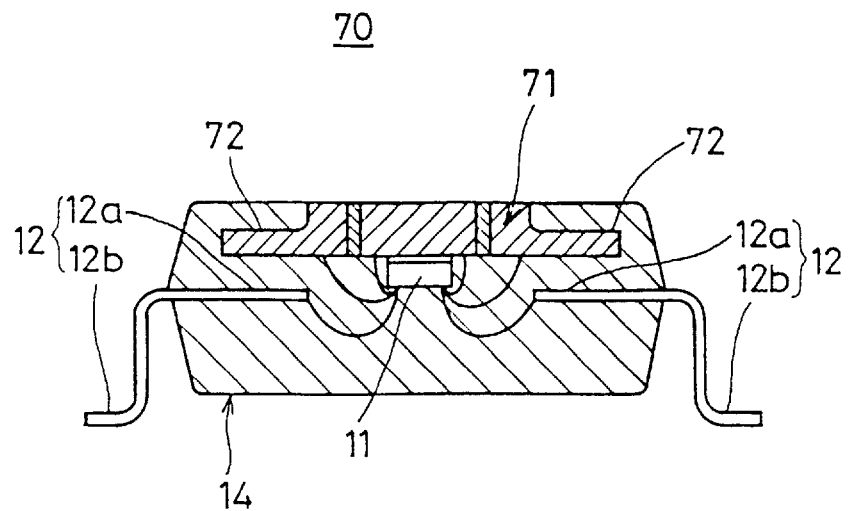
FIG. 19 is a cross sectional view showing a fourth embodiment of the semiconductor device according to the present invention.

Next, a description will be given of a fourth embodiment of the semiconductor device according to the present invention, by referring to FIG. 19. FIG. 19 shows a cross section of a semiconductor device 70. In FIG. 19, those parts which are the same as those corresponding parts of the semiconductor device 10 shown in FIGS. 2 and 3 are designated by the same reference numerals, and a description thereof will be omitted.

The semiconductor device 70 is characterized by an electrode member 71 which has a flange 72. The flange 72 extends in the same directions as the leads 12, and confronts the inner leads 12a. In addition, the flange 72 is grounded.

By providing the flange 72 which is grounded below the inner leads 12a of the leads 12, it is possible to realize a microstrip structure at the inner leads 12a. Thus, it is possible to reduce the inductance at each lead 12 and at the electrode part of the electrode member 71, and contribute to the high-speed operation of the semiconductor device 70. On the other hand, the flange 72 also has a shielding effect. For this reason, compared to the case where only the leads 12 are arranged, it is possible to reduce the noise caused by the connection such as the crosstalk noise.

Figure 20:
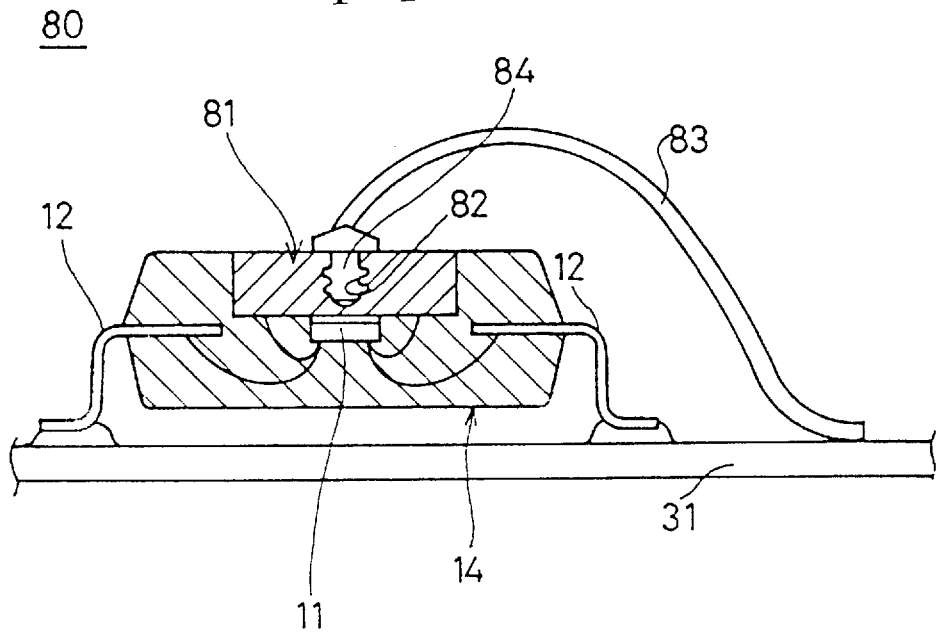
FIG. 20 is a cross sectional view showing a fifth embodiment of the semiconductor device according to the present invention mounted on the external circuit substrate.

Next, a description will be given of a fifth embodiment of the semiconductor device according to the present invention, by referring to FIG. 20. FIG. 20 shows a semiconductor device 80 which is mounted on the external circuit substrate 31. In FIG. 20, those parts which are the same as those corresponding parts of the semiconductor device 10 shown in FIGS. 2 and 3 are designated by the same reference numerals, and a description thereof will be omitted.

The semiconductor device 80 shown in FIG. 20 is characterized by a screw hole 82 which is formed in an electrode member 81, and a screw part 84 which is provided on the end of an electric cord 83 which connects to the electrode member 81. The electric cord 83 is electrically connected to the electrode member 81 by screwing the screw part 84 into the screw hole 82.

According to this embodiment, it is possible to improve the strength of both the electrical connection and the mechanical connection between the electrode member 81 and the electric cord 83. For this reason, it is possible to prevent unsatisfactory electrical contact and unwanted disconnection of the electric cord 83 from the electrode member 81 of the semiconductor device 80.

Figure 21:
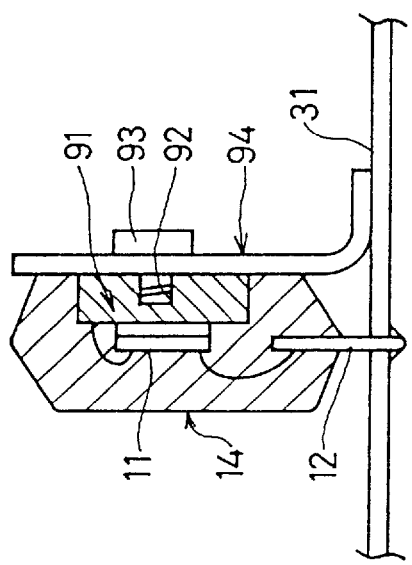
FIG. 21 is a cross sectional view showing a sixth embodiment of the semiconductor device according to the present invention mounted on the external circuit substrate.

Next, a description will be given of a sixth embodiment of the semiconductor device according to the present invention, by referring to FIG. 21. FIG. 21 shows a cross section of a semiconductor device 90 which is mounted on the external circuit substrate 31. In FIG. 21, those parts which are the same as those corresponding parts of the semiconductor device 10 shown in FIGS. 2 and 3 are designated by the same reference numerals, and a description thereof will be omitted.

In this embodiment, the present invention is applied to a single in-line package (SIP) type semiconductor device. Hence, the leads 12 only extend outwards from one side of the resin package 14. In addition, a screw hole 92 is formed in an electrode member 91, and a holder 94 is fixed to the semiconductor device 80 by a screw 93 which is screwed into the screw hole 92. The holder 94 has an approximate L-shape and is made of a metal having satisfactory conductive characteristic and thermal conduction characteristic. This holder 94 has the function of electrically connecting the electrode member 91 to the external circuit substrate 31, the function of holding the semiconductor device 90 in a vertical position on the external circuit substrate 31, and the function of radiating heat which is generated from the semiconductor chip 11.

According to this embodiment, it is possible to not only cope with the high-speed operation of the semiconductor device 90 and reduce the noise, but also improve the packaging density of the semiconductor device 90 on the external circuit substrate 31 because the semiconductor device 90 is the SIP type, and improve the heat radiation efficiency.

Figure 22:
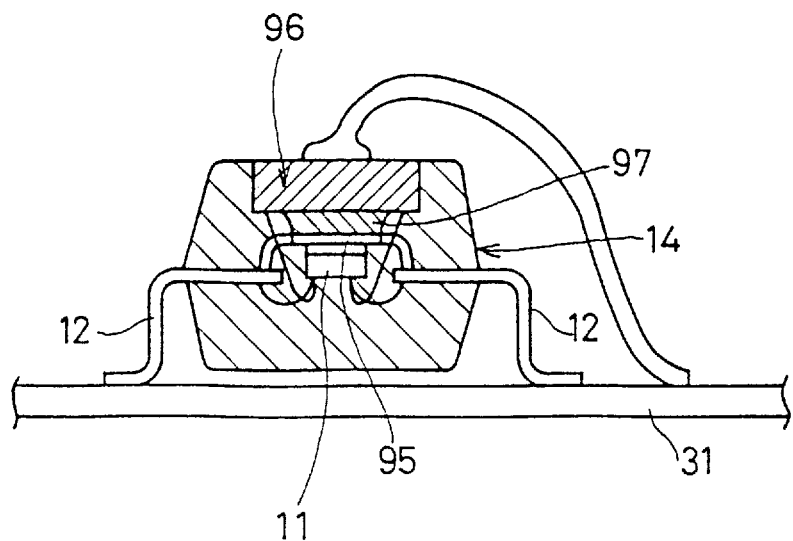
FIG. 22 is a cross sectional view showing a seventh embodiment of the semiconductor device according to the present invention mounted on the external circuit substrate.

Next, a description will be given of a seventh embodiment of the semiconductor device according to the present invention, by referring to FIG. 22. FIG. 22 shows a cross section of a semiconductor device 100. In FIG. 22, those parts which are the same as those corresponding parts of the semiconductor device 10 shown in FIGS. 2 and 3 are designated by the same reference numerals, and a description thereof will be omitted.

In the second through sixth embodiments described above, the semiconductor chip 11 is mounted directly on one of the electrode members 51, 61, 71, 81 and 91. However, in this seventh embodiment, the semiconductor chip 11 is mounted on a stage 95. In addition, an electrode member 96 is connected to the stage 95 using an adhesive agent 97.

Figure 23:
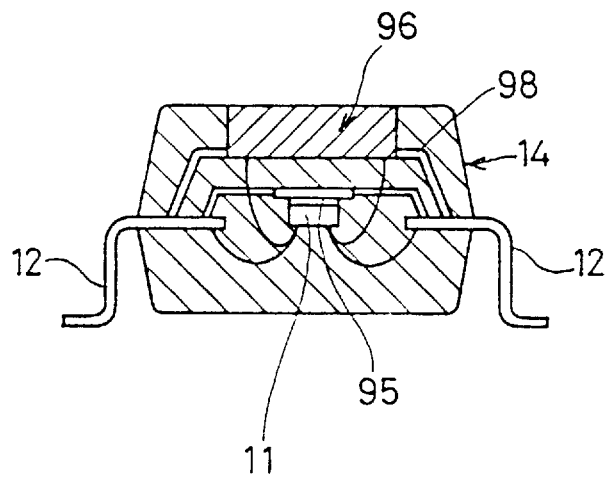
FIG. 23 is a cross sectional view showing an eighth embodiment of the semiconductor device according to the present invention.

Next, a description will be given of an eighth embodiment of the semiconductor device according to the present invention, by referring to FIG. 23. FIG. 23 shows a cross section of a semiconductor device 110. In FIG. 23, those parts which are the same as those corresponding parts of the semiconductor device 10 shown in FIG. 22 are designated by the same reference numerals, and a description thereof will be omitted.

In this embodiment, a support member 98 is additionally formed on the lead frame in addition to providing the stage 95 on which the semiconductor chip 11 is mounted. The electrode member 96 is mounted on this support member 98.

Figure 24:
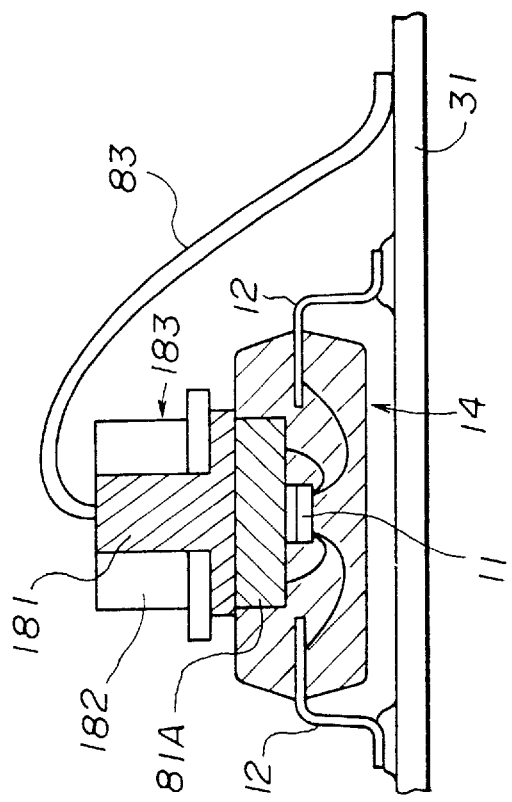
FIG. 24 is a cross sectional view showing a ninth embodiment of the semiconductor device according to the present invention.

Next, a description will be given of a ninth embodiment of the semiconductor device according to the present invention, by referring to FIG. 24. FIG. 24 shows a cross section of a semiconductor device 180. In FIG. 24, those parts which are the same as those corresponding parts in FIG. 20 are designated by the same reference numerals, and a description thereof will be omitted.

This embodiment is characterized by a fin structure 183 which integrally comprises a conductor member 181 and a fin member 182. The conductor member 181 is made of a conductor and is electrically connected to an electrode member 81A. On the other hand, the fin member 182 is made of aluminum (Al), for example, and includes a plurality of radiator fins. The electrical cord 83 electrically connects the semiconductor chip 11 and the external circuit substrate 31 via the electrode member 81A and the conductor member 181. In other words, the electrical cord 83 is connected to the conductor member 181 of the fin structure 183.

Figure 25A:
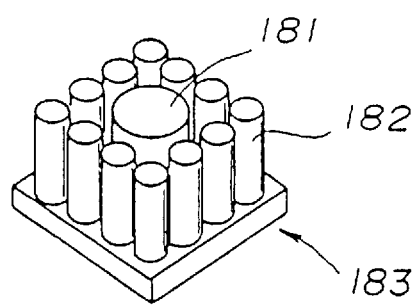
FIGS. 25(A), 25(B) and 25(C) show a fin structure of the ninth embodiment.
Figure 25B:
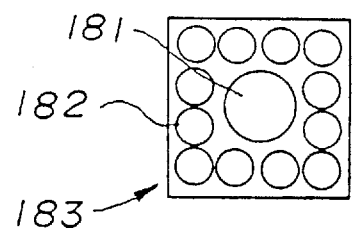
Figure 25C:
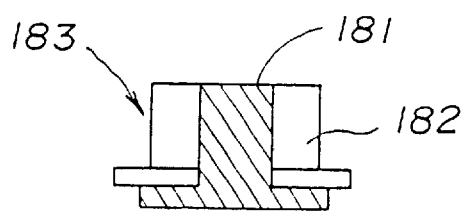

FIG. 25(A) shows a perspective view of the fin structure 183, FIG. 25(B) shows a plan view of the fin structure 183, and FIG. 25(C) shows a cross sectional view of the fin structure 183.

Figure 26A:
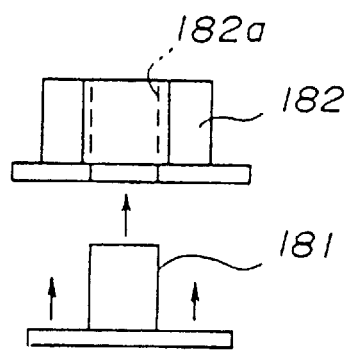
FIGS. 26(A) and 26(B) show a conductor member and a fin member of the ninth embodiment for explaining the process of assembling the fin structure.
Figure 26B:
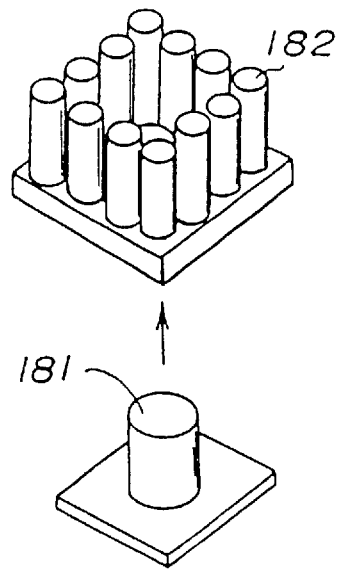

For example, the fin structure 183 may be assembled by inserting the projecting part of the conductor member 181 into a hole 182a in the fin member 182, as shown in FIG. 26(A). FIG. 26(A) shows a cross section and FIG. 26(B) shows a perspective view of the fin structure 183 which is being assembled. The conductor member 181 and the fin member 182 may be connected by an adhesive agent or the like.

According to this embodiment, it is possible to obtain the effects of the fifth embodiment described above and, additionally, to achieve improved heat radiation via the fin structure 183.

Further, the present invention is not limited to these embodiments, but various variations and modifications may be made without departing from the scope of the present invention.

What is claimed is:

1. A semiconductor device comprising:

a substrate having a first surface, a second surface and a plurality of conductor parts which comprise a plurality of via conductors formed in said substrate, said plurality of conductor parts extending from the first surface to the second surface of said substrate and exposed at both the first and second surfaces of said substrate;

a semiconductor chip provided on the first surface of said substrate and having a plurality of electrode pads;

a conductor pattern layout formed on the first surface of said substrate and comprising a continuous conductor pattern extending along at least two sides of said semiconductor chip, said conductor pattern layout being connected to the conductor parts formed in said substrate at the first surface and to at least one of a ground potential and a power source potential via the conductor parts;

a plurality of leads, each spaced apart from the first surface of said substrate;

a plurality of connecting means for electrically connecting said leads and the conductor pattern layout to corresponding ones of the electrode pads of said semiconductor chip, wherein the conductor parts formed in said substrate are electrically connected to ones of said electrode pads via said conductor pattern layout and ones of said plurality of connecting means; and a resin package encapsulating said semiconductor chip, respective parts of said leads and said substrate so that the conductor parts are exposed at the second surface of said substrate.

2. The semiconductor device as claimed in claim 1, wherein said substrate is made of ceramics.

3. The semiconductor device as claimed in claim 1, wherein said plurality of connecting means comprises:

first bonding wires electrically connecting said leads to the corresponding electrode pads of said semiconductor chip; and second bonding wires electrically connecting the conductor pattern layout to the corresponding electrode pads of said semiconductor chip.

4. The semiconductor device as claimed in claim 3, wherein various ones of the conductor parts of said substrate are electrically connected via the conductor pattern layout to respective ones of the electrode pads of said semiconductor chip, for supplying the at least one of the power source potential and the ground potential to said semiconductor chip through said respective ones of the electrode pads.

5. The semiconductor device as claimed in claim 1, wherein the conductor pattern layout comprises a plurality of first conductor patterns formed on the first surface of said substrate; and the semiconductor device further comprising another conductor pattern layout comprising a plurality of second conductor patterns formed on the second surface of said substrate;

wherein a plurality of via holes penetrates said substrate and extends from the first surface to the second surface of said substrate, and said plurality of via conductors are formed in the via holes and electrically connect corresponding ones of the first and second conductor patterns.

6. The semiconductor device as claimed in claim 1, wherein said substrate comprises a lead supporting projection formed on the first surface, supporting said leads.

7. A semiconductor device comprising:

a substrate having a first surface, a second surface and a plurality of conductor parts which comprise a plurality of via conductors formed in said substrate, said plurality of conductor parts extending from the first surface to the second surface of said substrate and exposed at both the first and second surfaces of said substrate;

a semiconductor chip provided on the first surface of said substrate and having a plurality of electrode pads;

a conductor pattern layout formed on the first surface of said substrate along at least two sides of said semiconductor chip, said conductor pattern layout connected to all of the conductor parts formed in said substrate at the first surface and to at least one of a ground potential and a power source potential;

a plurality of leads, each spaced apart from the first surface of said substrate;

a plurality of connecting means for electrically connecting said leads and the conductor pattern layout to corresponding ones of the electrode pads of said semiconductor chip, wherein all of the conductor parts formed in said substrate are electrically connected to ones of said electrode pads via said conductor pattern layout and ones of said plurality of connecting means; and a resin package encapsulating said semiconductor chip, respective parts of said leads and said substrate so that the conductor parts are exposed at the second surface of said substrate;

wherein said conductor pattern layout is formed on the first surface of said substrate and spaced apart from and partially confronting each of said leads, to form microstrips producing a microstrip effect with respect to said leads; and wherein a via hole penetrates said substrate and extends from the first surface to the second surface of said substrate, and one of said via conductors is formed in the via hole and electrically connects to the conductor pattern, said via conductor being exposed at the second surface of said substrate.

8. The semiconductor device as claimed in claim 7, wherein the conductor pattern is electrically connected to one of the electrode pads of said semiconductor chip, supplying one of a power source potential and a ground potential to said semiconductor chip through said one of the electrode pads.

9. A semiconductor device adapted to be mounted on an external circuit substrate having a mounting surface and a plurality of conductor patterns formed on the mounting surface, said semiconductor device comprising:

a substrate having a first surface, a second surface and a plurality of conductor parts which comprise a plurality of via conductors formed in said substrate, said plurality of conductor parts extending from the first surface to the second surface of the substrate exposed at both the first and second surfaces of the substrate;

a semiconductor chip provided on the first surface of said substrate and having a plurality of electrode pads;

a conductor pattern layout formed on the first surface of said substrate and comprising a continuous conductor pattern extending along at least two sides of said semiconductor chip, said conductor pattern layout being connected to the conductor parts formed in said substrate at the first surface and to at least one of a ground potential and a power source potential via the conductor parts;

a plurality of leads, each spaced apart from the first surface of said substrate;

a plurality of connecting means for electrically connecting said leads and the conductor pattern layout to corresponding ones of the electrode pads of said semiconductor chip, wherein the conductor parts formed in said substrate are electrically connected to ones of said electrode pads via said conductor pattern layout and ones of said plurality of connecting means; and a resin package encapsulating said semiconductor chip, respective parts of said leads and said substrate so that the conductor parts are exposed at the second surface of said substrate.

10. The semiconductor device as claimed in claim 9, wherein each conductor part of said substrate is located at a position such that the conductor parts make contact with corresponding ones of the conductor patterns of the external circuit substrate when said semiconductor device is mounted on the mounting surface of the external circuit substrate.

11. The semiconductor device as claimed in claim 9, further comprising an electric cord which has a first end connected to respective portions of the conductor parts and a second end connected to corresponding ones of the conductor patterns of the external circuit substrate.

12. The semiconductor device as claimed in claim 1, further comprising:

an insulative adhesive material formed between each of said plurality of leads and the first surface of said substrate.

13. A semiconductor device comprising:

a substrate having a first surface, a second surface and a plurality of conductor parts which comprise a plurality of via conductors formed in said substrate, said plurality of conductor parts extending from the first surface to the second surface of said substrate and exposed at both the first and second surfaces of said substrate;

a semiconductor chip provided on the first surface of said substrate and having a plurality of electrode pads;

a conductor pattern layout formed on the first surface of said substrate along at least two sides of said semiconductor chip, said conductor pattern layout connected to the conductor parts formed in said substrate at the first surface and to at least one of a ground potential and a power source potential;

a plurality of leads, each spaced apart from the first surface of said substrate;

a plurality of connecting means for electrically connecting said leads and the conductor pattern layout to corresponding ones of the electrode pads of said semiconductor chip, wherein the conductor parts formed in said substrate are electrically connected to ones of said electrode pads via said conductor pattern layout and ones of said plurality of connecting means; and a resin package encapsulating said semiconductor chip, respective parts of said leads and said substrate so that the conductor parts are exposed at the second surface of said substrate;

wherein said conductor pattern layout is formed on the first surface of said substrate and spaced apart from and partially confronting each of said leads, to form microstrips producing a microstrip effect with respect to said leads; and wherein a via hole penetrates said substrate and extends from the first surface to the second surface of said substrate, and one of said via conductors is formed in the via hole and electrically connects to the conductor pattern, said via conductor being exposed at the second surface of said substrate.

14. The semiconductor device as claimed in claim 13, wherein the conductor pattern is electrically connected to one of the electrode pads of said semiconductor chip, supplying one of a power source potential and a ground potential to said semiconductor chip through said one of the electrode pads.

* * * * *

UNITED STATES PATENT AND TRADEMARK OFFICE
CERTIFICATE OF CORRECTION

PATENT NO.:   5,808,357
DATED     :   September 15, 1998
INVENTOR(S):  Hideharu SAKODA et al.

It is certified that error appears in the above-identified patent and that said Letters Patent is hereby corrected as shown below:

Title Page, In the Abstract, line 8, change "ads" to --pads--.

Col. 2,   line 28, change "parts which are" to --part--.

Signed and Sealed this

Sixteenth Day of February, 1999

Attest:

Attesting Officer

*Acting Commissioner of Patents and Trademarks*